(12) United States Patent
Shen et al.

(10) Patent No.: US 7,708,056 B2
(45) Date of Patent: May 4, 2010

(54) FAN CONTROLLING SYSTEM AND METHOD

(75) Inventors: Chia-Jung Shen, Taipei (TW);
Min-Tsung Huang, Taipei (TW)

(73) Assignee: Inventec Corporation, Taipei (TW)

( * ) Notice: Subject to any disclaimer, the term of this patent is extended or adjusted under 35 U.S.C. 154(b) by 1070 days.

(21) Appl. No.: 11/395,370

(22) Filed: Mar. 30, 2006

(65) Prior Publication Data
US 2007/0231119 A1 Oct. 4, 2007

(51) Int. Cl.
*F24F 11/06* (2006.01)
(52) U.S. Cl. .......................... 165/247; 165/244; 417/32; 361/695; 700/299; 700/300
(58) Field of Classification Search ................ 165/244, 165/247; 361/695; 700/299, 300; 417/32; 318/268
See application file for complete search history.

(56) References Cited

U.S. PATENT DOCUMENTS

| | | | | |
|---|---|---|---|---|
| 6,414,843 B1 * | 7/2002 | Takeda | ....................... | 361/695 |
| 6,643,128 B2 * | 11/2003 | Chu et al. | .................... | 361/695 |
| 6,735,499 B2 * | 5/2004 | Ohki et al. | ................... | 700/299 |
| 7,102,308 B2 * | 9/2006 | Lacey et al. | ................. | 318/268 |
| 2003/0120394 A1 * | 6/2003 | Ziarnik | ....................... | 361/695 |
| 2005/0287008 A1 * | 12/2005 | Lacey et al. | .................... | 417/32 |

* cited by examiner

*Primary Examiner*—Ljiljana (Lil) V Ciric
(74) *Attorney, Agent, or Firm*—Peter F. Corless; Steven M. Jensen; Edwards Angell Palmer & Dodge LLP

(57) ABSTRACT

A fan controlling system and method is applicable to an electronic device with a fan for adjusting a temperature of the electronic device. The fan controlling system includes a plurality of temperature sensors installed in different regions inside of the electronic device for sensing temperatures around the regions, a mapping table for mapping a plurality of temperature ranges onto a plurality of rotation speeds, and a processing module for comparing the temperatures sensed by the temperature sensors and controlling the fan to rotate according to one of the rotation speeds onto which the mapping table maps one of the temperature ranges within which a highest one of the sensed temperatures is. Therefore, the fan can operate stably and does not generate a loud noise even when its rotation speed is changing, and has a longer lifespan.

10 Claims, 3 Drawing Sheets

FAN CONTROLLING SYSTEM AND METHOD

BACKGROUND OF THE INVENTION

1. Field of the Invention

This invention relates to a fan controlling system and method, and more particularly, to a fan controlling system and method for linearly adjusting a rotation speed of a fan.

2. Description of Related Art

With the rapid development of computer technologies, computers are becoming one of the most important electronic devices in daily lives. Since modern computers have better efficiency and can manage more complicated tasks, a central processing unit (CPU) in a computer has to be able to operate in a high operating speed. However, the CPU, if operating in the high operating speed, generates too much heat. The heat crashes the computer occasionally, or even brings nonrecoverable damages on hardware components in the computer permanently. Therefore, heat dissipating systems are becoming one of the most popular research fields in the art.

One of the most common heat dissipating systems is a combination of a fan and a plurality of heat dissipating plates. Such the combination has a simple structure, and has a variety of advantages, such as low cost, highly reliable performance, and adopting mature technologies. In order to dissipate the heat efficiently, the fan has to rotate at a high rotation speed occasionally. However, the fan, when rotating at too high a rotation speed, generates a loud noise. Moreover, the fan, if rotating at the high rotation speed all the time, is easily to have a breakdown.

A first fan controlling system of the prior art is brought to the market to solve the above problems. The first fan controlling system comprises a temperature sensor, and is applicable to an electronic device (i.e. a computer host or a desktop computer) having a fan capable of rotating at two rotation speeds, i.e. a low rotation speed and a high rotation speed. Please refer to FIG. 1, which shows a first relation between temperature and time of the first fan controlling system. As shown in FIG. 1, a first temperature curve 10 represents a temperature of the electronic device. Heat generated by the CPU changes the temperature. When the temperature exceeds a temperature threshold Ct, the fan is controlled to rotate at the high rotation speed, or the fan is controller to rotate at the low rotation speed, as shown by a rotation speed curve 12 in FIG. 1. One drawback of the first fan controlling system is that the fan has to change to rotate from high rotation speed to low rotation speed and vice versa frequently if the temperature fluctuates around the temperature threshold all the time. Such an scenario shortens the lifespan of the fan.

Please refer to FIG. 2, which shows a second relation between temperature and time of a second fan controlling system according to the prior art. In addition to the temperature threshold Ct, another temperature threshold $Ct_1$, which differs form the temperature threshold Ct by a small temperature difference $\Delta t$, is added to the second relation. When the temperature exceeds the temperature threshold Ct (an upper bound), the fan is controlled to rotate at the high rotation speed. When the temperature is still lower than the temperature threshold $Ct_1$ (a lower bound), the fan is controlled to rotate at the low rotation speed. When the temperature is within the temperature thresholds Ct and $Ct_1$, the rotation speed of the fan is not changed, so as to stabilize the operation of the fan. However, the second fan controlling system still suffers the drawback of the first fan controlling system. For instance, the fan still has to change to rotate from high rotation speed to low rotation speed and vice versa frequently if the temperature fluctuates around the temperature thresholds Ct and $Ct_1$ all the time (i.e. a second temperature curve 20 fluctuates around the temperature threshold $Ct_1$, the fan has a rotation speed 220 changing abruptly). Such a scenario still shortens the lifespan of the fan.

Therefore, it is becoming one of the urgent errands in the art to present a fan controlling system and method to overcome the drawbacks of the prior art. Such the fan controlling system and method controls the fan to rotate without the influence of temperature fluctuation and reduces a noise made by the operating fan, and prolongs the lifespan of the fan.

SUMMARY OF THE INVENTION

In views of the above-mentioned problems of the prior art, it is a primary objective of the present invention to provide a fan controlling system and method to prevent a rotation speed of a fan of an electronic device from be adjusted abruptly when a temperature of the electronic device changes.

It is another objective of the present invention to provide a fan controlling system and method. If controlled by the fan controlling system and method, a fan consumes less electricity and has a longer lifespan.

To achieve the above-mentioned and other objectives, a fan controlling system and method are provided according to the present invention. The fan controlling system is applicable to an electronic device and is used for adjusting a temperature of the electronic device. The fan controlling system includes a plurality of temperature sensors installed in different regions inside of the electronic device for sensing temperatures around the regions, a mapping table for mapping a plurality of temperature ranges onto a plurality of rotation speeds, and a processing module for comparing the temperatures sensed by the temperature sensors and controlling the fan to rotate at one of the rotation speeds onto which the mapping table maps one of the temperature ranges within which a highest one of the temperatures is.

The fan controlling method is also applicable to the electronic device. The method includes installing a plurality of temperature sensors in different regions inside of the electronic device and having the temperature sensors to sense temperatures around the regions, establishing a mapping table for mapping a plurality of temperature ranges onto a plurality of rotation speeds, and having a processing module to compare the temperatures sensed by the temperature sensors and control the fan to rotate at one of the rotation speeds onto which the mapping table maps one of the temperature ranges within which a highest one of the temperatures is.

In contrast to the prior art, the fan controlling system and method controls the fan to rotate in accordance with a mapping table, so the rotation speed of the fan changes linearly and does not change abruptly even when the temperature of the electronic device fluctuates around a temperature threshold. Therefore, the fan can operate stably and does not generate a loud noise, and has a longer lifespan.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
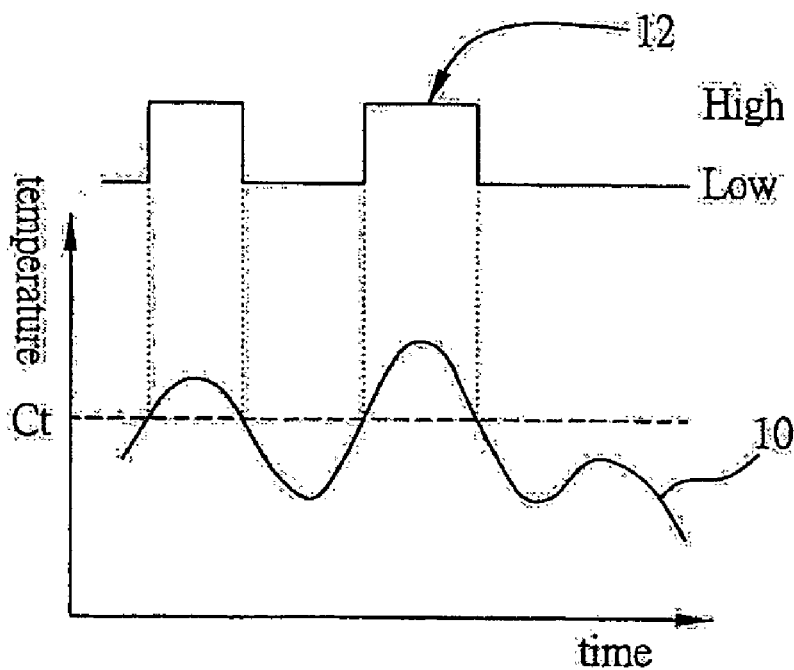
FIG. 1 shown a first relation between temperature and time of a first fan controlling method according to the prior art.
Figure 2:
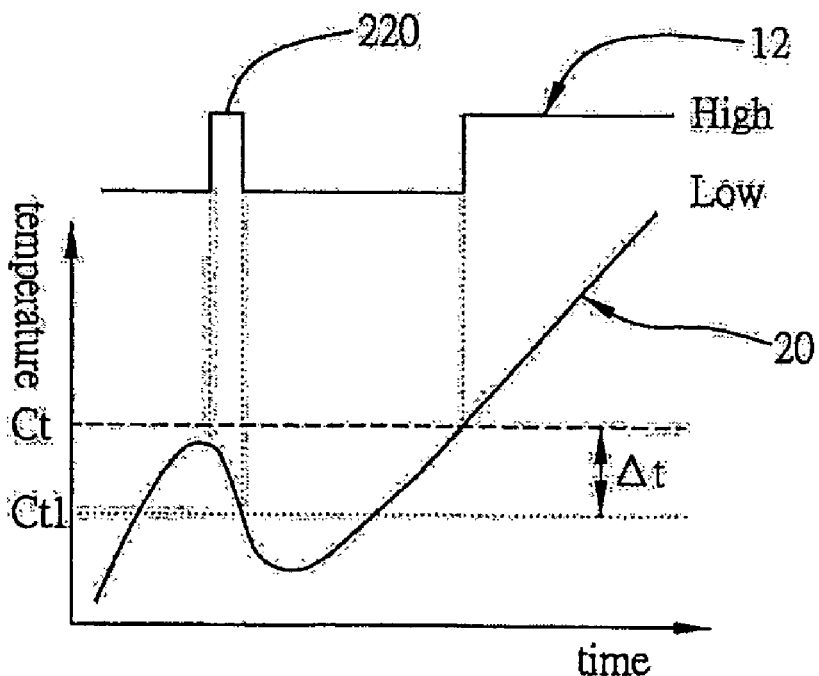
FIG. 2 shows a second relation between temperature and time of a second fan controlling method according to the prior art.
Figure 3:
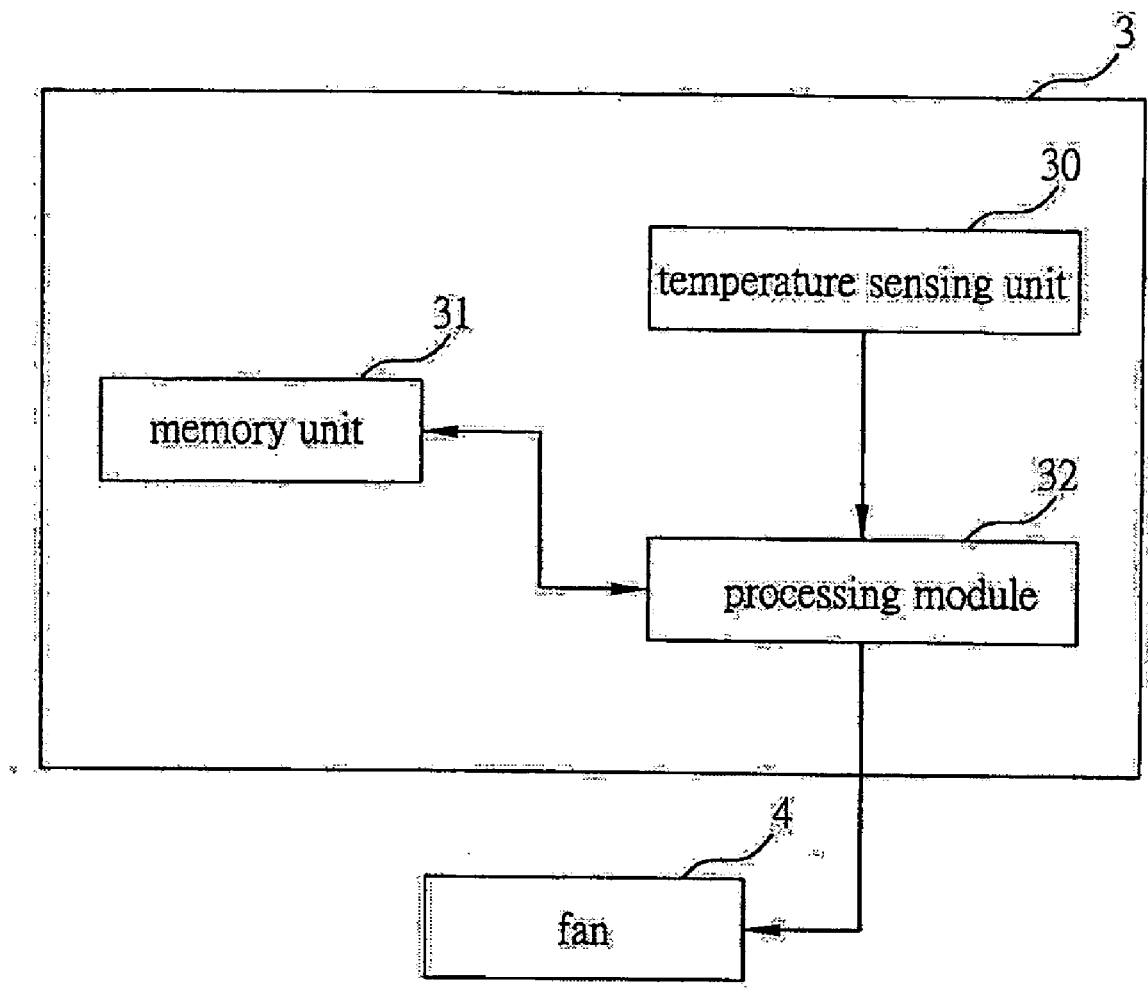
FIG. 3 is a functional block diagram of a fan controlling system of the preferred embodiment and a fan according to the present invention.

FIG. 3 is a functional block diagram of a fan controlling system 3 of the preferred embodiment and a fan 4 according to the present invention. The fan controlling system 3 comprises a temperature sensing unit 30, a memory unit 31 and a processing module 32. The processing module 32 is connected to the fan 4. The fan controlling system 3 is applicable to an electronic device adopting a fan to adjust a temperature thereof. According to the preferred embodiment, the electronic device is a server.

The temperature sensing unit 30 comprises a plurality of temperature sensors. The temperature sensors are installed in different regions inside of the electronic device for sensing temperatures around the regions. The temperature sensors transmit the sensed temperatures in the form of control signals to the processing module 32.

A mapping table is stored in the memory unit 31. The mapping table maps a plurality of temperature ranges onto a plurality of rotation speeds. For example, the mapping table maps a first temperature range 50-51° C. to a first rotation speed of 64 rounds per minute (rpm), and a second temperature range 51-52° C. to a second rotation speed of 80 rpm. Likewise, each of the temperature ranges corresponds to one of the rotation speeds. According to the preferred embodiment, the rotation speeds of the mapping table are linearly distributed.

In operation, the processing module 32 compares the temperatures sensed by the temperature sensors and controls the fan 4 to rotate at one of the rotation speeds onto which the mapping table maps one of the temperature ranges within which a highest one of the temperatures is. For example, when the temperature sensors transmit two temperatures T1 and T2 (T2 is assumed to be higher than T1 and within the second temperature range 51-52° C.) to the processing module 32, the processing module 32, after comparing that the temperature T2 is higher than the temperature T1, controls the fan 4 to rotate at the second rotation speed of 80 rpm, onto which the mapping table maps the second temperature range 51-52° C., within which the second rotation speed of 80 rpm is. The temperature sensors keep sensing the temperatures around the regions inside of the electronic device, and the processing module 32 keeps adjusting the rotation speed of the fan 4, as long as the electronic device is operating.

According to the preferred embodiment, the processing module 32 is a baseboard management controller (BMC), and controls the fan 4 to rotate by issuing to the fan 4 pulse width modulation (PWM) control signals having duty cycles corresponding to the rotation speeds, and the memory unit 31 is a read only memory (ROM) such as a ROM for storing basic input/output system (BIOS).

Figure 4:
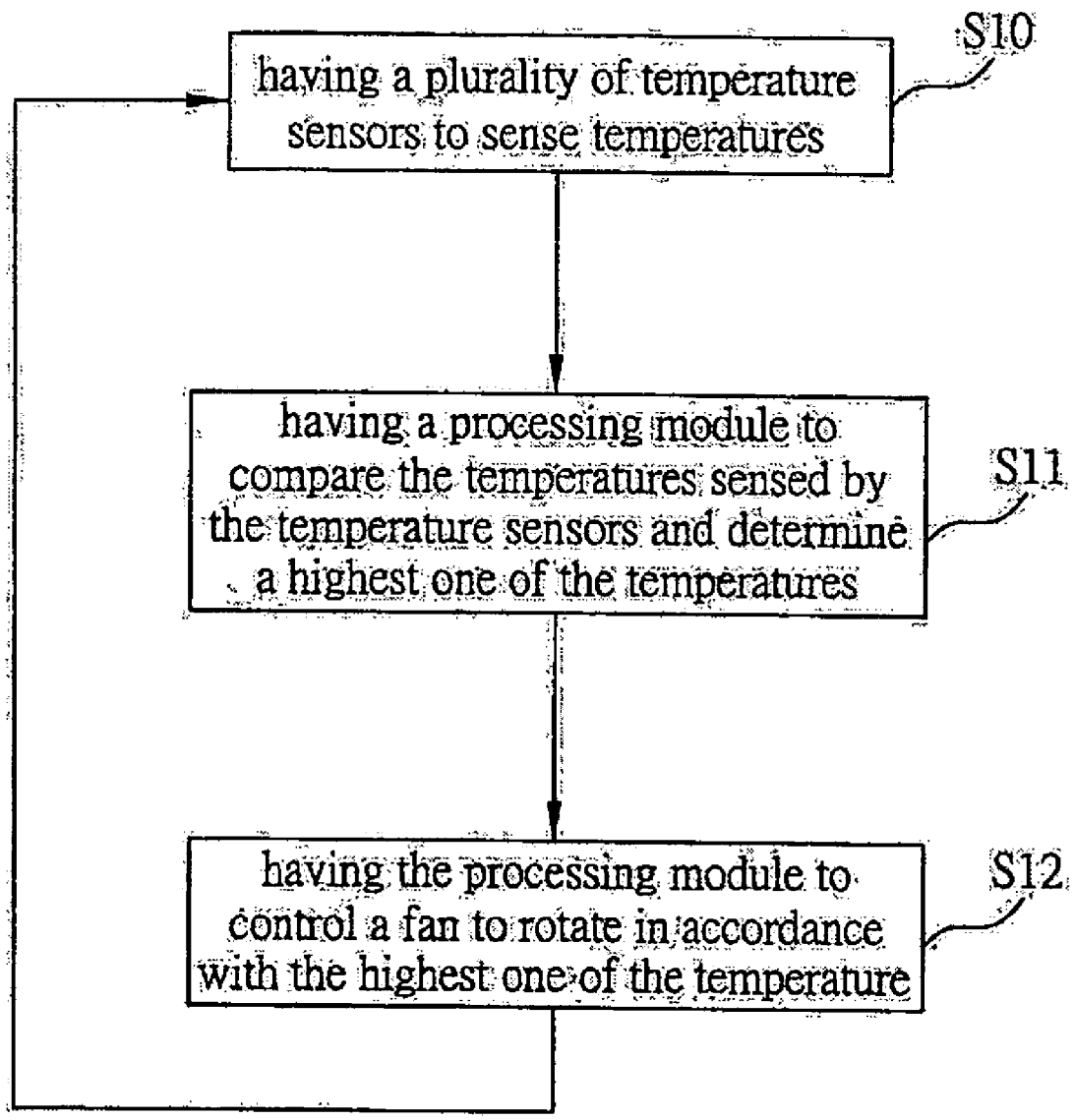
FIG. 4 is a fan controlling method corresponding to the fan controlling system shown in FIG. 3 according to the present invention.

FIG. 4 is a flow chart of a fan controlling method corresponding to the fan controlling system 3 according to the present invention. The fan controlling method is also applicable to the electronic device. The method starts in step S10.

In step S10, the method installs a plurality of temperature sensors in different regions inside of the electronic device and has the temperature sensors to sense temperatures around the regions. The temperature sensors transmit the temperatures T1 and T2, for example, to the processing module 32. The method then proceeds to step S11.

In step S11, the method has the processing module 32 to compare the temperatures T1 and T2 and determine a higher one of the temperatures T1 and T2. The method then proceeds to step S12.

In step S12, the method has the processing module 32 to control the fan 4 to rotate at one of the rotation speeds (80 rpm) onto which the mapping table maps one of the temperature ranges (the second temperature range 51-52° C.) within which a highest one of the temperatures is (the temperature T2). The method then returns to step S10 to keep controlling the rotation speed of the fan 4 based on the temperatures sensed by the temperature sensors.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A fan controlling system applicable to an electronic device with a fan for adjusting a temperature of the electronic device, the fan controlling system comprising:
   a plurality of temperature sensors installed in different regions inside of the electronic device for sensing temperatures around the regions;
   a memory unit for storing a mapping table for mapping a plurality of temperature ranges onto a plurality of rotation speeds; and
   a processing module for comparing the temperatures sensed by the temperature sensors and controlling the fan to rotate at one of the rotation speeds onto which the mapping table maps one of the temperature ranges within which a highest one of the sensed temperatures is.

2. The fan controlling system of claim 1, wherein the rotation speeds of the mapping table are linearly distributed.

3. The fan controlling system of claim 1, wherein the processing module is a controller.

4. The fan controlling system of claim 3, wherein the controller is a baseboard management controller (BMC).

5. The fan controlling system of claim 1, wherein the processing module controls the fan to rotate by issuing to the fan a pulse width modulation (PWM) control signal having a duty cycle corresponding to the rotation speed.

6. A fan controlling method applicable to an electronic device with a fan for adjusting a temperature of the electronic device, the fan controlling method comprising the steps of:
   installing a plurality of temperature sensors in different regions inside of the electronic device and having the temperature sensors to sense temperatures around the regions;
   establishing a mapping table for mapping a plurality of temperature ranges onto a plurality of rotation speeds, and storing the mapping table in a memory unit; and having a processing module to compare the temperatures sensed by the temperature sensors and control the fan to rotate at one of the rotation speeds onto which the mapping table maps one of the temperature ranges within which a highest one of the sensed temperatures is.

7. The fan controlling method of claim 6, wherein the rotation speeds of the mapping table are linearly distributed.

8. The fan controlling method of claim 6, wherein the processing module is a controller.

9. The fan controlling method of claim 8, wherein the controller is a BMC.

10. The fan controlling method of claim 6, wherein the processing module controls the fan to rotate by issuing to the fan a PWM control signal having a duty cycle corresponding to the rotation speed.

* * * * *